US012615711B2

(12) United States Patent (10) Patent No.: US 12,615,711 B2

Fukaya et al. (45) Date of Patent: Apr. 28, 2026

(54) PRINTED CIRCUIT BOARD

(71) Applicants: SUMITOMO ELECTRIC INDUSTRIES, LTD., Osaka (JP); SUMITOMO ELECTRIC PRINTED CIRCUITS, INC., Shiga (JP)

(72) Inventors: Yosuke Fukaya, Osaka (JP); Koji Nitta, Osaka (JP); Shoichiro Sakai, Osaka (JP); Takuto Hidani, Osaka (JP); Yoshihito Yamaguchi, Shiga (JP)

(73) Assignees: Sumitomo Electric Industries, Ltd., Osaka (JP); SUMITOMO ELECTRIC PRINTED CIRCUITS, INC., Shiga (JP)

( * ) Notice: Subject to any disclaimer, the term of this patent is extended or adjusted under 35 U.S.C. 154(b) by 248 days.

(21) Appl. No.: 18/697,469

(22) PCT Filed: Jun. 7, 2023

(86) PCT No.: PCT/JP2023/021104

§ 371 (c)(1),
(2) Date: Mar. 31, 2024

(87) PCT Pub. No.: WO2023/243500

PCT Pub. Date: Dec. 21, 2023

(65) Prior Publication Data

US 2024/0407085 A1 Dec. 5, 2024

(30) Foreign Application Priority Data

Jun. 14, 2022 (JP) ................................. 2022-095739

(51) Int. Cl.
H05K 1/00 (2006.01)
H05K 1/02 (2006.01)

(52) U.S. Cl.
CPC .................................. H05K 1/0296 (2013.01)

(58) Field of Classification Search
CPC ........ H05K 1/0296; H05K 1/09; H05K 3/108; H05K 3/188
See application file for complete search history.

(56) References Cited

U.S. PATENT DOCUMENTS

2016/0037629 A1* 2/2016 Takahashi ................ H05K 3/18
 174/257
2017/0135206 A1* 5/2017 Ueda ......................... H05K 1/05
2018/0160546 A1* 6/2018 Ori ........................ H05K 3/4661

FOREIGN PATENT DOCUMENTS

JP 2019-75456 A 5/2019
JP 2019-197851 A 11/2019

* cited by examiner

*Primary Examiner* — Pete T Lee
(74) *Attorney, Agent, or Firm* — Renner, Otto, Boisselle & Sklar, LLP

(57) ABSTRACT

A printed circuit board includes a base film having a main surface, and an electrically conductive pattern disposed on the main surface. The electrically conductive pattern includes an electrically conductive base layer disposed on the main surface directly or indirectly, and a copper electroplating layer disposed on the electrically conductive base layer. The void density, being a value obtained by dividing a sum of areas of voids within a predetermined observation length at an interface between the electrically conductive base layer and the copper electroplating layer by the observation length, is more than $0.01\ \mu m^2/\mu m$ and $5.5\ \mu m^2/\mu m$ or less.

6 Claims, 11 Drawing Sheets

PRINTED CIRCUIT BOARD

TECHNICAL FIELD

The present disclosure relates to a printed circuit board. This application claims priority based on Japanese Patent Application No. 2022-095739 filed on Jun. 14, 2022, and the entire contents of the Japanese patent application are incorporated herein by reference.

BACKGROUND ART

Japanese Unexamined Patent Application Publication No. 2019-197851 (PTL 1) describes a printed circuit board. The printed circuit board described in PTL 1 has a base film and an electrically conductive pattern.

The base film has a main surface. The electrically conductive pattern is disposed on the main surface. The electrically conductive pattern includes a seed layer, a copper electroless plating layer, and a copper electroplating layer. The seed layer is disposed on the main surface. The copper electroless plating layer is disposed on the seed layer. The copper electroplating layer is disposed on the copper electroless plating layer. The copper electroless plating layer and the copper electroplating layer are formed of copper. That is, the electrically conductive pattern is formed by using a semi-additive method.

In the printed circuit board of PTL 1, the void density at an interface between the copper electroless plating layer and the copper electroplating layer is $0.01 \ \mu m^2/\mu m$ or less. It is noted that, the void density at the interface between the copper electroless plating layer and the copper electroplating layer is a value obtained by dividing a sum of the areas of voids present at the interface between the copper electroless plating layer and the copper electroplating layer in a range having a predetermined observation length in the sectional view by the observation length.

In the printed circuit board described in PTL 1, the void density at the interface between the copper electroless plating layer and the copper electroplating layer is set to $0.01 \ \mu m^2/\mu m$ or less, and thus the peeling of the electrically conductive pattern from the base film is suppressed.

CITATION LIST

Patent Literature

PTL 1: Japanese Unexamined Patent Application Publication No. 2019-197851

SUMMARY OF INVENTION

A printed circuit board of the present disclosure includes a base film having a main surface, and an electrically conductive pattern disposed on the main surface. The electrically conductive pattern includes an electrically conductive base layer disposed on the main surface directly or indirectly, and a copper electroplating layer disposed on the electrically conductive base layer. A void density is more than $0.01 \ \mu m^2/\mu m$ and $5.5 \ \mu m^2/\mu m$ or less, the void density being a value obtained by dividing a sum of areas of voids present in a range having a predetermined observation length at an interface between the electrically conductive base layer and the copper electroplating layer by the observation length. When a thickness of the electrically conductive base layer is T ($\mu m$), the observation length is L ($\mu m$), and a sum of lengths of the voids present at the interface in the range having the observation length is VL ($\mu m$), a value of $T \times VL/L$ is 0.39 or less in the range having the observation length.

BRIEF DESCRIPTION OF THE DRAWINGS

FIG. 5 is a schematic enlarged cross-sectional view of the interface between an electroless plating layer 25 and a copper electroplating layer 26.

DETAILED DESCRIPTION

Figure 1:
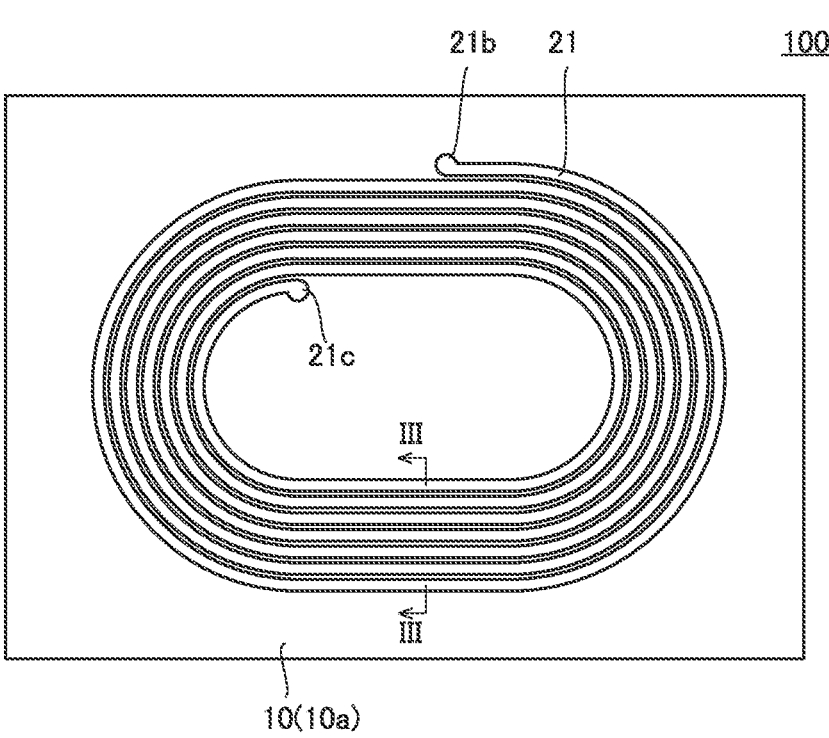
FIG. 1 is a plan view of a printed circuit board 100.

Problems to be Solved by Present Disclosure

When the electrically conductive pattern is formed by the semi-additive method, a copper electroless plating layer is first formed on a seed layer. Second, a resist pattern is formed on the copper electroless plating layer. Third, a copper electroplating layer is formed on the copper electroless plating layer exposed from the opening portion of the resist pattern. Fourth, the resist pattern is removed. Fifth, the copper electroless plating layer and the seed layer exposed between the adjacent portions of the copper electroplating layer are removed by etching.

When the void density at the interface between the copper electroless plating layer and the copper electroplating layer increases, side etching is likely to proceed at the interface between the copper electroless plating layer and the copper electroplating layer by etching for removing the copper electroless plating layer and the seed layer exposed between the adjacent portions of the copper electroplating layer. Excessive progresses of such side etching causes a part of the electrically conductive pattern to be peeled off from the base film.

For example, when an adhesion assisting process is performed to ensure adhesion between the resist pattern and the copper electroless plating layer during formation of the resist pattern, or when a resist pattern having a large thickness is used to ensure the thickness of the copper electroplating layer, it may be difficult to set the void density at the interface between the copper electroless plating layer and the copper electroplating layer to $0.01 \ \mu m^2/\mu m$ or less due to the influence of contamination remaining on the copper electroless plating layer.

Advantageous Effects of Present Disclosure

According to the printed circuit board of the present disclosure, even when the void density at the interface between the electrically conductive base layer and the copper electroplating layer is increased, it is possible to suppress the peeling of a part of the electrically conductive pattern from the base film due to the side etching at the interface between the electrically conductive base layer and the copper electroplating layer.

The present disclosure has been made in view of the above-described problems of the prior art. To be more specific, the present inventors have found that when the void density, which is a value obtained by dividing a sum of areas of voids present in a range having a predetermined observation length at the interface between the electrically conductive base layer and the copper electroplating layer by the observation length, is more than 0.01 $\mu m^2/\mu m$ and 5.5 $\mu m^2/\mu m$ or less, the peeling of a part of the electrically conductive pattern from the base film can be suppressed. Further, the present inventors have found that the peeling of the electrically conductive pattern is caused by side etching at the interface between the electrically conductive base layer and the copper electroplating layer, and that the side etching amount is correlated with the thicknesses of the copper electroless plating layer and the electrically conductive base layer. The present disclosure provides a printed circuit board capable of suppressing a part of an electrically conductive pattern from being peeled off from a base film.

DESCRIPTION OF EMBODIMENTS OF PRESENT DISCLOSURE

First, embodiments of the present disclosure will be listed and described.

(1) A printed circuit board according to an embodiment includes a base film having a main surface, and an electrically conductive pattern disposed on the main surface. The electrically conductive pattern includes an electrically conductive base layer disposed on the main surface directly or indirectly, and a copper electroplating layer disposed on the electrically conductive base layer. A void density is more than 0.01 $\mu m^2/\mu m$ and 5.5 $\mu m^2/\mu m$ or less, the void density being a value obtained by dividing a sum of areas of voids present in a range having a predetermined observation length at an interface between the electrically conductive base layer and the copper electroplating layer by the observation length. When a thickness of the electrically conductive base layer is T ($\mu m$), the observation length is L ($\mu m$), and a sum of lengths of the voids present at the interface in the range having the observation length is VL ($\mu m$), a value of T×VL/L is 0.39 or less in the range having the observation length. It is noted that, the electrically conductive base layer being directly disposed on the main surface means that the main surface and the electrically conductive base layer are in contact with each other, and the electrically conductive base layer being indirectly disposed on the main surface means that at least one layer (for example, a seed layer described later) is disposed between the main surface and the electrically conductive base layer.

According to the printed circuit board of (1), even when the void density at the interface between the electrically conductive base layer and the copper electroplating layer increases, it is possible to suppress the peeling of a part of the electrically conductive pattern from the base film due to the side etching at the interface between the electrically conductive base layer and the copper electroplating layer.

(2) The printed circuit board of (1) may further include the electrically conductive pattern further includes a seed layer disposed on the main surface. The electrically conductive base layer may include a base layer disposed on the seed layer, and an electroless plating layer disposed on the base layer.

(3) In the printed circuit board of (2), the base layer and the electroless plating layer may be each made of copper.

(4) In the printed circuit board according to (1) to (3), a thickness of the electrically conductive pattern may be 5 $\mu m$ to 150 $\mu m$.

(5) In the printed circuit board according to (1) to (4), a side etching amount at the interface may be 0.33 times or less a width of the electrically conductive pattern.

(6) In the printed circuit board according to any one of (1) to (5), the electrically conductive pattern may include a plurality of wiring portions adjacent to each other. A distance between two of the plurality of wiring portions, the two being adjacent to each other, may be 5 $\mu m$ to 100 $\mu m$.

Details of Embodiments of Present Disclosure

The details of embodiments of the present disclosure will be described with reference to the drawings. In the drawings, the same or corresponding parts are denoted by the same reference numerals, and the description thereof will not be repeated. The printed circuit board according to the embodiment is referred to as a printed circuit board 100.

(Configuration of Printed Circuit Board 100)

The configuration of printed circuit board 100 will be described below.

Figure 2:
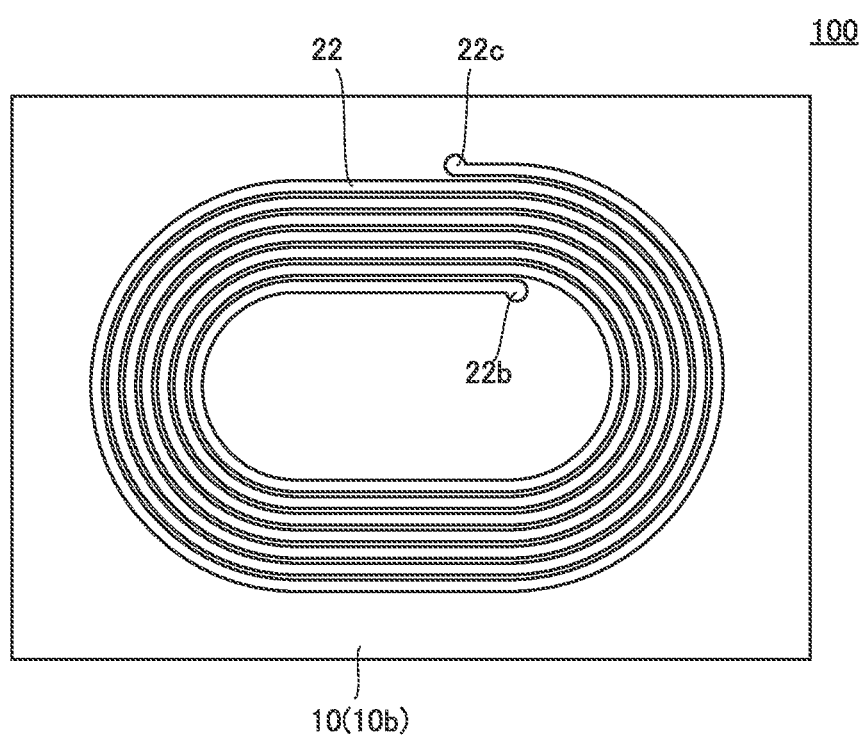
FIG. 2 is a bottom plan view of printed circuit board 100.
Figure 3:
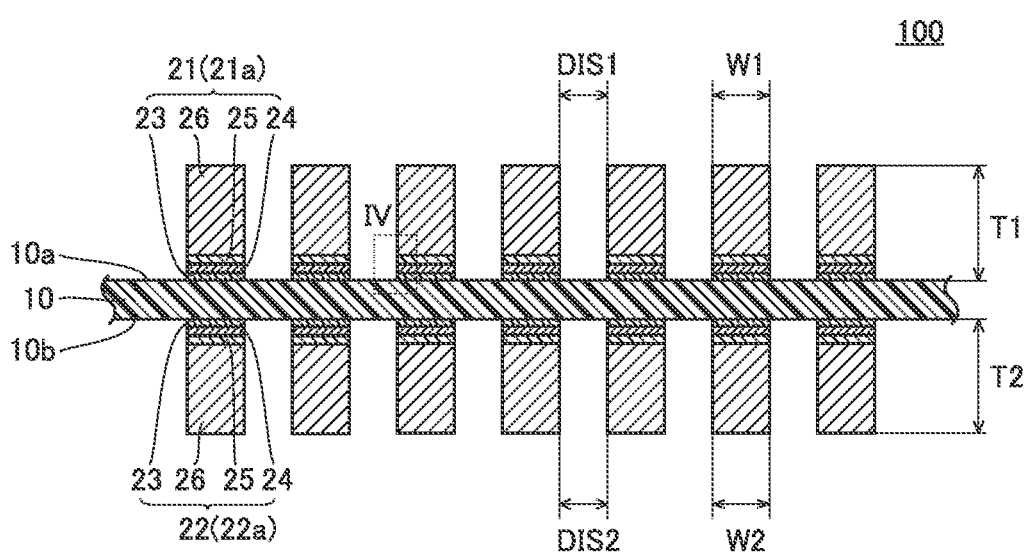
FIG. 3 is a cross-sectional view taken along the line III-III in FIG. 1.
Figure 4:
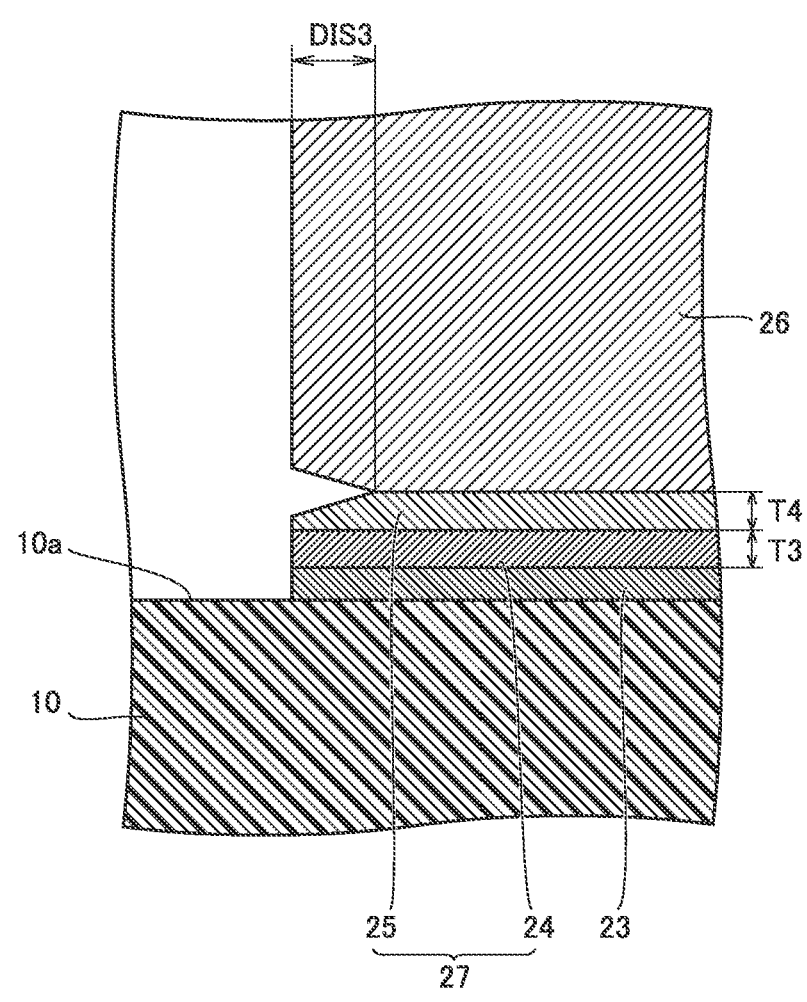
FIG. 4 is an enlarged view of the IV in FIG. 3.

FIG. 1 is a plan view of printed circuit board 100. FIG. 2 is a bottom plan view of printed circuit board 100. FIG. 2 shows printed circuit board 100 as viewed from the opposite side to that in FIG. 1. FIG. 3 is a cross-sectional view taken along the line III-III in FIG. 1. FIG. 4 is an enlarged view of IV in FIG. 3. As shown in FIGS. 1 to 4, printed circuit board 100 has a base film 10, an electrically conductive pattern 21, and an electrically conductive pattern 22.

Base film 10 has a main surface 10a and a main surface 10b. Main surface 10a and main surface 10b are end surfaces in the thickness direction of base film 10. Main surface 10b is a surface opposite to main surface 10a. Base film 10 is formed of a material having electrically insulating property and flexibility. Base film 10 is made of, for example, polyimide or liquid crystal polymer.

Electrically conductive pattern 21 is disposed on main surface 10a. Electrically conductive pattern 21 is wound in a spiral shape in a plan view. Electrically conductive pattern 21 includes a plurality of wiring portions 21a adjacent to each other.

Electrically conductive pattern 22 is disposed on main surface 10b. Electrically conductive pattern 22 is wound in a spiral shape in a plan view. Electrically conductive pattern 22 includes a plurality of wiring portions 22a adjacent to each other.

Electrically conductive pattern 21 has a land 21b at one end and has a land 21c at another end. Land 21b and land 21c are respectively located at the outermost circumference and the innermost circumference of electrically conductive pattern 21. Electrically conductive pattern 22 has a land 22b at one end and a land 22c at another end. Land 22b and land 22c are respectively at the innermost circumference and the outermost circumference of electrically conductive pattern 22. Land 21c and land 22b overlap each other in a plan view.

The width of electrically conductive pattern 21 is referred to as a width W1, and the width of electrically conductive pattern 22 is referred to as a width W2. Width W1 and width W2 are, for example, 5 μm to 50 μm. The thickness of electrically conductive pattern 21 is referred to as a thickness T1. The thickness of electrically conductive pattern 22 is referred to as a thickness T2. Thickness T1 is, for example, 5 μm to 150 μm, may be 8 μm to 100 μm, and may be 30 μm to 100 μm. Thickness T2 is, for example, 5 μm to 150 μm, and may be 8 μm to 100 μm. Thickness T2 may be 30 μm to 100 μm. The distance between two adjacent wiring portions 21a is referred to as a distance DIS1. The distance between two adjacent wiring portions 22a is referred to as a distance DIS2. Distance DIS1 and distance DIS2 are, for example, 5 μm to 100 μm. Distance DIS1 and distance DIS2 may be 5 μm to 20 μm.

Thickness T1, thickness T2, distance DIS1, and distance DIS2 are measured by the following method. First, a cross-sectional image is acquired using a scanning electron microscope (SEM) in a cross section along the thickness direction of base film 10 and orthogonal to the length direction of electrically conductive pattern 21 (electrically conductive pattern 22) in a plan view. Second, in the acquired cross-sectional image, the thickness of electrically conductive pattern 21, the thickness of electrically conductive pattern 22, the distance between two adjacent wiring portions 21a, and the distance between two adjacent wiring portions 22a are measured. This measurement is performed at a position where the width of electrically conductive pattern 21 (electrically conductive pattern 22) is maximized on the cross-sectional image. In this way, the values of thickness T1, thickness T2, distance DIS1, and distance DIS2 are obtained.

Each of electrically conductive pattern 21 and electrically conductive pattern 22 is formed by, for example, a semi-additive method. More specifically, each of electrically conductive pattern 21 and electrically conductive pattern 22 includes a seed layer 23, a base layer 24, an electroless plating layer 25, and a copper electroplating layer 26. Base layer 24 and electroless plating layer 25 may be collectively referred to as an electrically conductive base layer 27.

Seed layer 23 is disposed on the main surface (main surface 10a, main surface 10b) of base film 10. Seed layer 23 is, for example, a sputtered layer (a layer formed by sputtering). Seed layer 23 is made of, for example, a nickel-chromium alloy. Base layer 24 is disposed on seed layer 23. That is, electrically conductive base layer 27 is disposed on the main surface of base film 10 with seed layer 23 interposed therebetween. Base layer 24 is, for example, a sputtered layer. Base layer 24 may be made of copper. It is noted that, each of electrically conductive pattern 21 and electrically conductive pattern 22 may not include seed layer 23. In this case, electrically conductive base layer 27 is disposed directly on the main surface of base film 10.

Electroless plating layer 25 is disposed on base layer 24. Electroless plating layer 25 is a layer formed by electroless plating. Electroless plating layer 25 may be made of copper. Copper electroplating layer 26 is disposed on electroless plating layer 25. Copper electroplating layer 26 is a layer formed by electrolytic plating. Copper electroplating layer 26 is made of copper.

Although not shown, a through hole is formed in base film 10. The through hole of base film 10 penetrates base film 10 along the thickness direction. The through hole of base film 10 overlaps land 21c and land 22b in a plan view.

Electroless plating layer 25 is also disposed on the inner wall surface of the through hole of base film 10. Copper electroplating layer 26 is also provided in the through hole of base film 10. Thus, electrically conductive pattern 21 and electrically conductive pattern 22 are electrically connected to each other. When a voltage is applied between land 21b and land 22c, a current flows in a spiral shape in electrically conductive pattern 21 and electrically conductive pattern 22, and a magnetic field is generated by the current. That is, printed circuit board 100 is a coil device.

Figure 5:
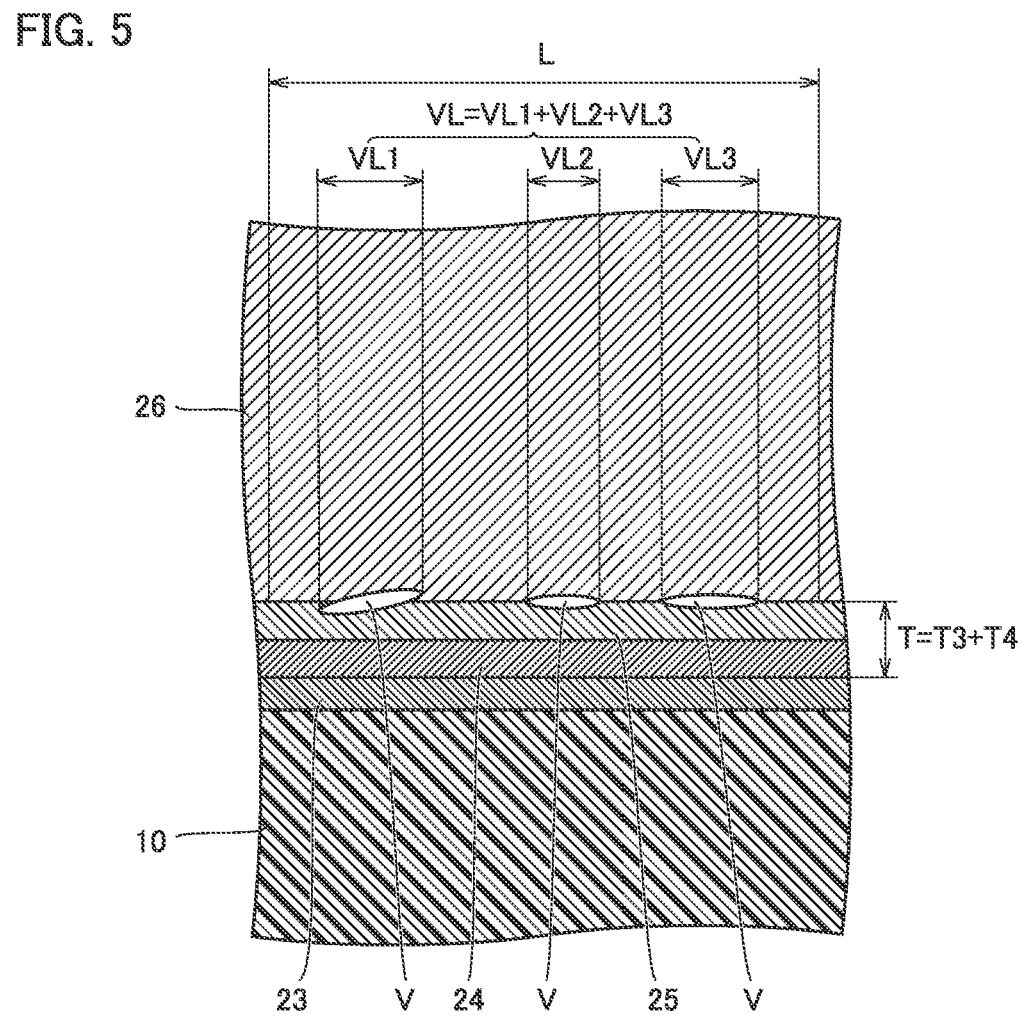

FIG. 5 is a schematic enlarged cross-sectional view of the interface between electroless plating layer 25 and copper electroplating layer 26. As shown in FIG. 5, the thickness of base layer 24 and the thickness of electroless plating layer 25 are respectively referred to as a thickness T3 and a thickness T4. The sum of thickness T3 and thickness T4 is referred to as T (μm). That is, T is the thickness of electrically conductive base layer 27. Thickness T3 and thickness T4 are measured by the same method as that of thickness T1 (thickness T2).

A void V exists at the interface between electroless plating layer 25 and copper electroplating layer 26, that is, at the interface between electrically conductive base layer 27 and copper electroplating layer 26. The void density at the interface between electroless plating layer 25 and copper electroplating layer 26 is more than 0.01 μm²/μm and 5.5 μm²/μm or less. It is noted that, the void density at the interface between electroless plating layer 25 and copper electroplating layer 26 is a value obtained by dividing a sum of the areas of voids present at the interface between electroless plating layer 25 and copper electroplating layer 26 in a range having a predetermined observation length in the sectional view by the observation length.

In calculating the void density at the interface between electroless plating layer 25 and copper electroplating layer 26, first, a cross-sectional image is obtained by using an SEM in a cross section orthogonal to the main surface of base film 10. The magnification of the cross-sectional image is set to be 10,000 times to 50,000 times.

Second, the sum area of voids V present in the range having the predetermined observation length (hereinafter, this observation length may be referred to as L (μm)) is measured at the interface between electroless plating layer 25 and copper electroplating layer 26 in the cross-sectional image. The direction of the observation length is parallel to the main surface of base film 10. The area of void V is obtained by binarizing the cross-sectional image so that void V is black using image processing software such as GNU Image Manipulation Program, and calculating the ratio of the black portion from a histogram of lightness obtained by using the image processing software. Thirdly, the void density at the interface between electroless plating layer 25 and copper electroplating layer 26 is calculated by dividing the calculated sum area of voids V by the above observation length.

In the interface between electroless plating layer 25 and copper electroplating layer 26 in the cross-sectional image, the sum of the lengths of voids V present in the range having the observation length is referred to as VL (μm). In the example shown in FIG. 5, three voids V exist at the interface between electroless plating layer 25 and copper electroplating layer 26. When the lengths of three voids V are referred to as VL1, VL2 and VL3, respectively, VL1, VL2 and VL3 are the lengths of three voids V in the direction along the interface between electroless plating layer 25 and copper electroplating layer 26, respectively. VL is the sum of VL1, VL2 and VL3. The value of T×VL/L is 0.39 or less.

As shown in FIG. 4, the etching for forming electrically conductive pattern 21 (electrically conductive pattern 22) has a predetermined side etching amount. The side etching amount is a depth of a notch formed at the interface between electroless plating layer 25 and copper electroplating layer 26 by side etching in a direction along the interface. In other words, the side etching amount is a distance DIS3 between the vertex of the notch and the farthest end of electrically conductive base layer 27 in the direction along the interface between electroless plating layer 25 and copper electroplating layer 26. Distance DIS3 may be 0.33 times or less width W1 (width W2), or may be 0.17 times or less width W1 (width W2). Distance DIS3 is measured by the same method as distance DIS1 (distance DIS2).

(Method of Manufacturing Printed Circuit Board 100)

Hereinafter, a method of manufacturing printed circuit board 100 will be described.

Figure 6:
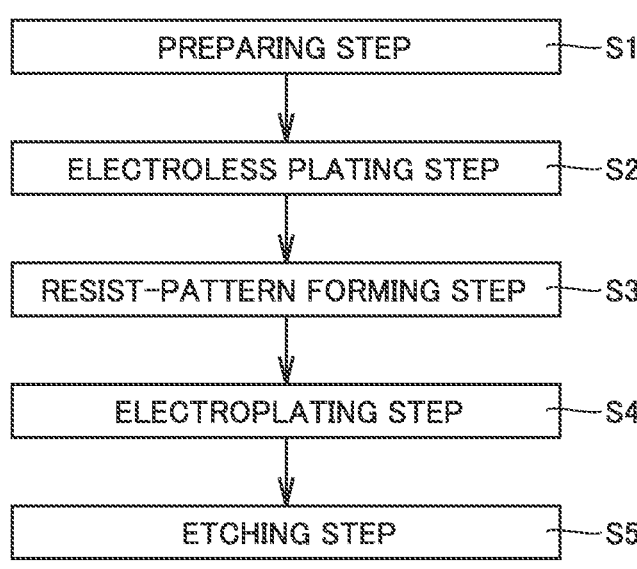
FIG. 6 is a manufacturing step chart of printed circuit board 100.

FIG. 6 is a manufacturing step chart of printed circuit board 100. As shown in FIG. 6, the method of manufacturing printed circuit board 100 includes a preparing step S1, an electroless plating step S2, a resist-pattern forming step S3, an electroplating step S4, and an etching step S5. Electroless plating step S2 is performed after preparing step S1. Resist-pattern forming step S3 is performed after electroless plating step S2. Electroplating step S4 is performed after resist-pattern forming step S3. Etching step S5 is performed after electroplating step S4.

Figure 7:
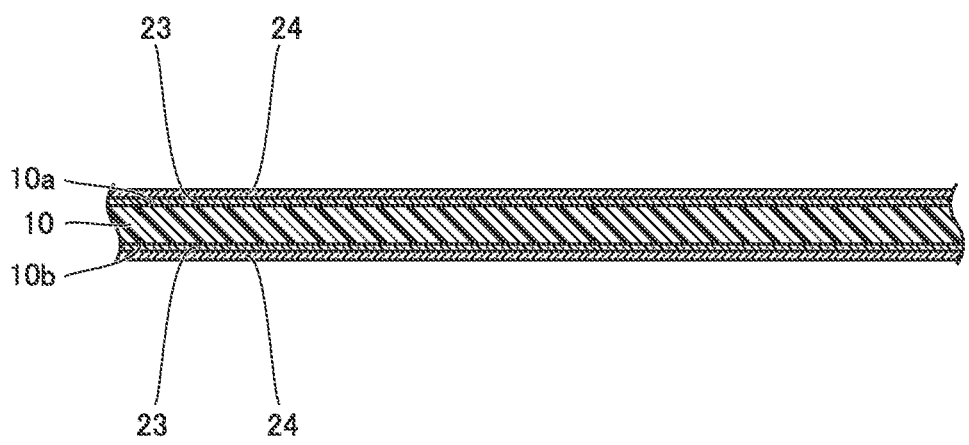
FIG. 7 is a cross-sectional view for explaining a preparing step S1.

FIG. 7 is a cross-sectional view for explaining preparing step S1. As shown in FIG. 7, in preparing step S1, base film 10 is prepared. It is noted that, in base film 10 prepared in preparing step S1, seed layer 23 is disposed on main surface 10a and main surface 10b, and base layer 24 is disposed on seed layer 23.

Figure 8:
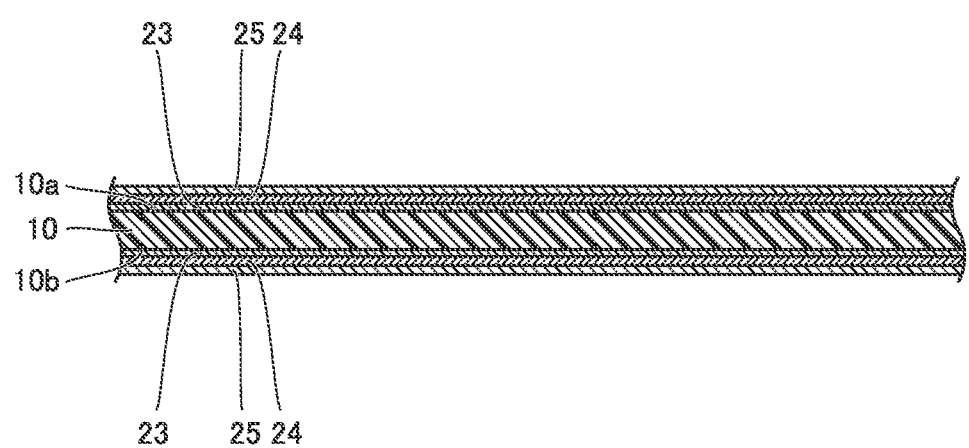
FIG. 8 is a cross-sectional view for explaining an electroless plating step S2.

FIG. 8 is a cross-sectional view for explaining electroless plating step S2. As shown in FIG. 8, in electroless plating step S2, the electroless plating is performed to form electroless plating layer 25 on base layer 24.

Although not shown, prior to the above-described electroless plating, a hole is formed in base film 10, thereby forming a through hole. Therefore, electroless plating layer 25 is formed also on the inner wall surface of the through hole of base film 10 by the above-described electroless plating.

Figure 9:
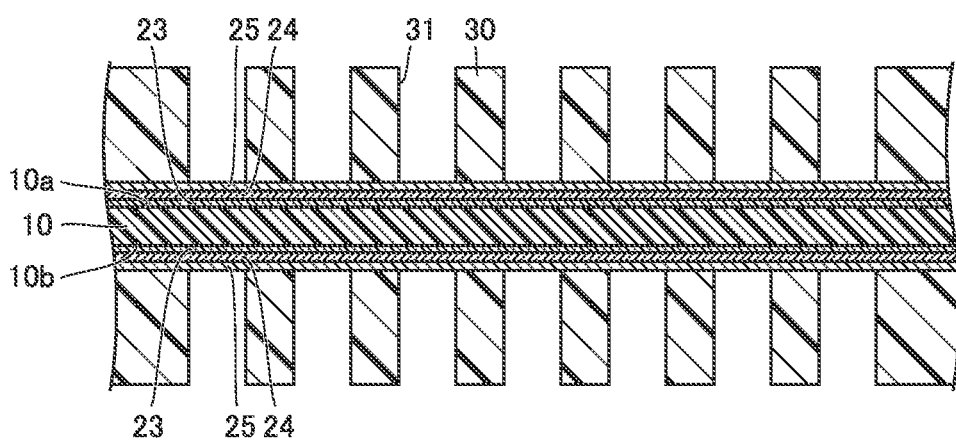
FIG. 9 is a cross-sectional view for explaining a resist-pattern forming step S3.

FIG. 9 is a cross-sectional view for explaining resist-pattern forming step S3. As shown in FIG. 9, in resist-pattern forming step S3, a resist pattern 30 is formed on electroless plating layer 25. An opening portion 31 is formed in resist pattern 30. Opening portion 31 penetrates resist pattern 30 along the thickness direction. That is, electroless plating layer 25 is exposed from opening portion 31.

In resist-pattern forming step S3, first, a dry film resist is attached onto electroless plating layer 25. In this case, in order to ensure adhesion between the dry film resist (resist pattern 30) and electroless plating layer 25, the adhesion assisting process may be performed on the surface of electroless plating layer 25.

Second, the dry film resist is exposed and developed, and thus the dry film resist is partially removed to form opening portion 31. Thus, resist pattern 30 is formed. After resist pattern 30 is formed, the surface of electroless plating layer 25 exposed from opening portion 31 may be cleaned using plasma or the like.

Figure 10:
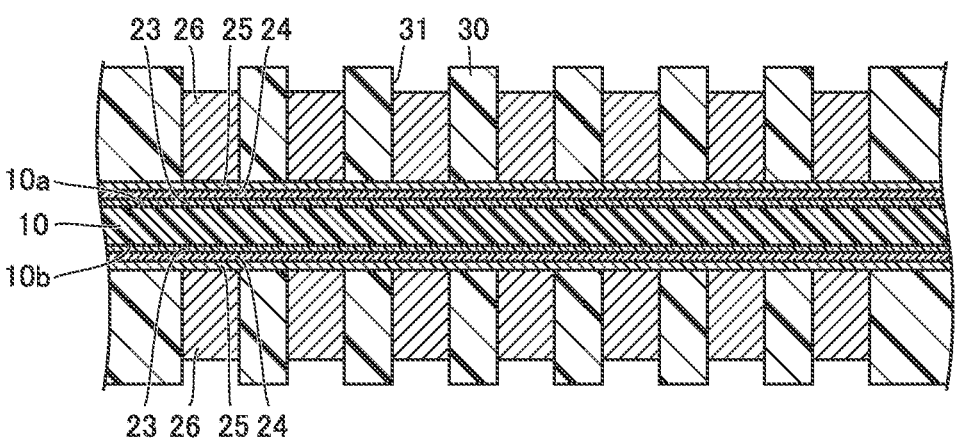
FIG. 10 is a cross-sectional view for explaining an electroplating step S4.

FIG. 10 is a cross-sectional view for explaining electroplating step S4. As shown in FIG. 10, in electroplating step S4, electrolytic plating is performed to form copper electroplating layer 26 on electroless plating layer 25 exposed from opening portion 31. When thickness T1 (thickness T2) increases (when the thickness of copper electroplating layer 26 increases), resist pattern 30 is formed to be thick accordingly. After copper electroplating layer 26 is formed, resist pattern 30 is removed.

In etching step S5, electroless plating layer 25, base layer 24, and seed layer 23 exposed between adjacent copper electroplating layers 26 are removed by etching. At this time, side etching may proceed at the interface between copper electroplating layer 26 and electroless plating layer 25 located thereunder.

(Effects of Printed Circuit Board 100)

When resist pattern 30 is formed, the adhesion assisting process may be performed to ensure adhesion between resist pattern 30 and electroless plating layer 25. In addition, when resist pattern 30 having a large thickness is used to ensure the thickness of copper electroplating layer 26, the ratio of the thickness of resist pattern 30 to the width of opening portion 31 increases, and thus, contamination remains on the surface of electroless plating layer 25 due to deterioration in chemical permeability to opening portion 31, deterioration in resist component removability, or deterioration in foreign material removal performance on the surface of electroless plating layer 25 in resist-pattern forming step S3. When the value obtained by dividing the thickness of resist pattern 30 by the width of opening portion 31 is more than 0.5, the void density at the interface between electroless plating layer 25 and copper electroplating layer 26 may increase (more specifically, more than 0.01 $\mu m^2/\mu m$ and 5.5 $\mu m^2/\mu m$ or less).

When thickness T3 and thickness T4 increase, it is necessary to increase the etching amount of etching step S5, and the side etching is likely to proceed. Further, when the void density at the interface between electroless plating layer 25 and copper electroplating layer 26 increases, side etching is likely to proceed at the interface between electroless plating layer 25 and copper electroplating layer 26 by the etching in etching step S5. Excessive progress of the side etching causes a part of electrically conductive pattern 21 and electrically conductive pattern 22 to be peeled off from the base film. However, as shown in the following evaluation result, by setting the value obtained by dividing the product value of the sum of thicknesses T3 and T4, which are indexes for evaluating the side etching amount, and the sum of the lengths of voids present at the interface between electroless plating layer 25 and copper electroplating layer 26 in the range having the predetermined observation length by the observation length, that is, by setting the value of T×VL/L to 0.39 or less, even when the void density at the interface between electroless plating layer 25 and copper electroplating layer 26 increases, the peeling of a part of electrically conductive pattern 21 (electrically conductive pattern 22) from base film 10 is suppressed.

Table 1 shows details of Samples 1 to 9. Samples 1 to 9 were formed by performing preparing step S1 to etching step S5. It is noted that, when forming Samples 1 to 9, in resist-pattern forming step S3, the adhesion assisting process is performed on the surface of electroless plating layer 25, and then resist pattern 30 is formed on electroless plating layer 25. As shown in Table 1, in Samples 1 to 9, the sum (value of T) of the thickness of base layer 24 and the thickness of electroless plating layer 25, the observation length (value of L), and the sum (value of VL) of the lengths of voids V present at the interface between electroless plating layer 25 and copper electroplating layer 26 in the range having the observation length were measured. In Samples 1 to 9, the value obtained by dividing the thickness of resist pattern 30 by the width of opening portion 31 was more than 0.5, and the void density at the interface between electroless plating layer 25 and copper electroplating layer 26 was in the range of more than 0.01 μm²/μm and 5.5 μm²/μm or less.

In Samples 1 to 9, the presence or absence of peeling of electrically conductive pattern 21 and electrically conductive pattern 22 was observed visually or using a microscope. The samples in which electrically conductive pattern 21 and electrically conductive pattern 22 were not peeled off are indicated as "OK" in Table 1. On the other hand, the samples in which electrically conductive pattern 21 (electrically conductive pattern 22) was partially peeled off are indicated as "NG" in Table 1.

TABLE 1

| Sample | 1 | 2 | 3 | 4 | 5 | 6 | 7 | 8 | 9 |
|---|---|---|---|---|---|---|---|---|---|
| T (μm) | 0.42 | 0.51 | 1.24 | 0.55 | 0.53 | 0.62 | 0.56 | 0.52 | 0.77 |
| VL (μm) | 0.48 | 0.83 | 0.60 | 0.93 | 1.03 | 1.27 | 1.54 | 1.70 | 1.89 |
| L (μm) | 3.90 | 2.30 | 3.67 | 2.37 | 1.85 | 2.01 | 1.91 | 1.96 | 2.10 |
| T × VL/L | 0.05 | 0.18 | 0.20 | 0.22 | 0.29 | 0.39 | 0.45 | 0.45 | 0.69 |
| Peeling of Electrically Conductive Pattern | OK | OK | OK | OK | OK | OK | NG | NG | NG |

In Samples 1 to 6, the value of T×VL/L was 0.39 or less, and electrically conductive pattern 21 and electrically conductive pattern 22 were not peeled off. On the other hand, in Samples 7 to 9, the value of T×VL/L was more than 0.39, and electrically conductive pattern 21 and electrically conductive pattern 22 were partially peeled off.

From this comparison, it is clear that even when the void density at the interface between electroless plating layer 25 and copper electroplating layer 26 is large, the side etching at the interface between electroless plating layer 25 and copper electroplating layer 26 is suppressed by setting the value of T×VL/L to 0.39 or less, and the peeling of a part of electrically conductive pattern 21 and electrically conductive pattern 22 from base film 10 is suppressed.

(Modification)

Figure 11:
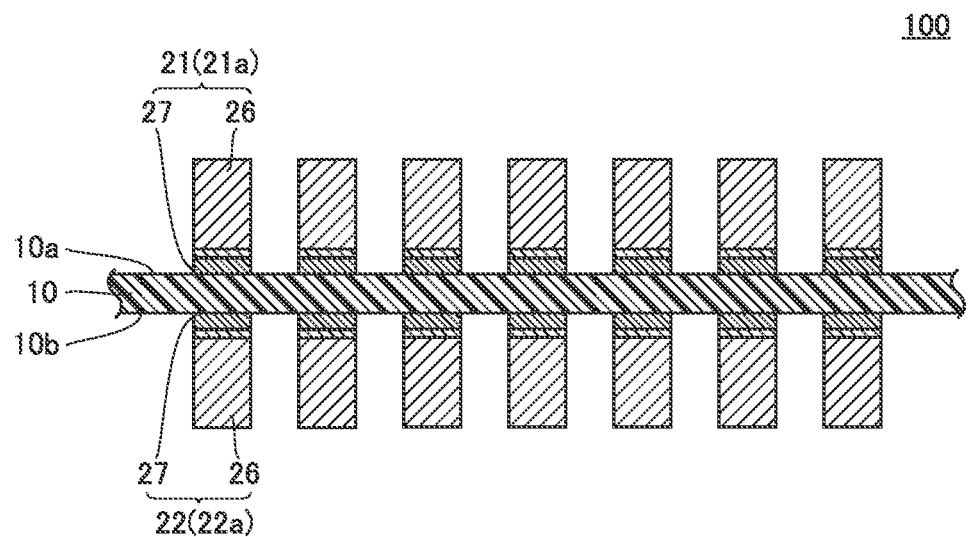
FIG. 11 is a cross-sectional view of printed circuit board 100 according to the modification.

FIG. 11 is a cross-sectional view of printed circuit board 100 according to the modification. FIG. 11 shows a cross section at a position corresponding to FIG. 3. In the above description, the example in which electrically conductive base layer 27 formed of two layers of base layer 24 and electroless plating layer 25 has been described, but electrically conductive base layer 27 may be formed of a single layer as shown in FIG. 11. In this case, when the value of T×VL/L is calculated, the value of T is set to the value of the thickness of electrically conductive base layer 27. In the example shown in FIG. 11, electrically conductive base layer 27 is disposed directly on the main surface of base film 10.

It should be understood that the embodiments disclosed herein are illustrative and non-restrictive in every respect. The scope of the present invention is defined by the terms of the claims rather than the embodiments described above, and is intended to include any modifications within the scope and meaning equivalent to the terms of the claims.

REFERENCE SIGNS LIST

100 printed circuit board, 10 base film, 10a, 10b main surface, 21 electrically conductive pattern, 21a wiring portion, 21b, 21c land, 22 electrically conductive pattern, 22a wiring portion, 22b land, 22c land, 23 seed layer, 24 base layer, 25 electroless plating layer, 26 copper electroplating layer, 27 electrically conductive base layer, 30 resist pattern, 31 opening portion, DIS1, DIS2, DIS3 distance, S1 preparing step, S2 electroless plating step, S3 resist-pattern forming step, S4 electroplating step, S5 etching step, T1, T2, T3, T4 thickness, V void, W1, W2 width

The invention claimed is:

1. A printed circuit board comprising:
a base film having a main surface; and
an electrically conductive pattern disposed on the main surface,
wherein the electrically conductive pattern includes an electrically conductive base layer disposed on the main surface directly or indirectly, and a copper electroplating layer disposed on the electrically conductive base layer,
wherein a void density is more than 0.01 μm²/μm and 5.5 μm²/μm or less, the void density being a value obtained by dividing a sum of areas of voids present in a range having a predetermined observation length at an interface between the electrically conductive base layer and the copper electroplating layer by the observation length, and
wherein, when a thickness of the electrically conductive base layer is T (μm), the observation length is L (μm), and a sum of lengths of the voids present at the interface in the range having the observation length is VL (μm), a value of T×VL/L is 0.39 or less in the range having the observation length.

2. The printed circuit board according to claim 1, wherein the electrically conductive pattern further includes a seed layer disposed on the main surface, and wherein the electrically conductive base layer includes a base layer disposed on the seed layer, and an electroless plating layer disposed on the base layer.

3. The printed circuit board according to claim 2, wherein the base layer and the electroless plating layer are each made of copper.

4. The printed circuit board according to claim 1, wherein a thickness of the electrically conductive pattern is 5 μm to 150 μm.

5. The printed circuit board according to claim 1, wherein a side etching amount at the interface is 0.33 times or less a width of the electrically conductive pattern.

6. The printed circuit board according to claim 1, wherein the electrically conductive pattern includes a plurality of wiring portions adjacent to each other, and wherein a distance between two of the plurality of wiring portions, the two being adjacent to each other, is 5 μm to 100 μm.

* * * * *